(12) United States Patent
Chappaz Gillot et al.

(10) Patent No.: US 9,396,970 B2
(45) Date of Patent: Jul. 19, 2016

(54) METHOD FOR ELECTROCHEMICALLY MANUFACTURING CUSCN NANOWIRES (71) Applicant: Commissariat A L'Energie Atomique Et Aux Energie Alternatives, Paris (FR)

(72) Inventors: Cyril Chappaz Gillot, Meylan (FR);
Solenn Berson, Chambery (FR);
Valentina Ivanova, Grenoble (FR);
Raul Salazar Romero, Erlangen (DE)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 254 days.

(21) Appl. No.: 13/916,817

(22) Filed: Jun. 13, 2013

(65) Prior Publication Data
US 2013/0334054 A1    Dec. 19, 2013

(30) Foreign Application Priority Data
Jun. 15, 2012    (FR) ...................... 12 55604

(51) Int. Cl.
*H01L 21/48*    (2006.01)
*C25D 3/38*    (2006.01)
*C25D 9/08*    (2006.01)

(52) U.S. Cl.
CPC .............. *H01L 21/4885* (2013.01); *C25D 3/38* (2013.01); *C25D 9/08* (2013.01)

(58) Field of Classification Search
CPC ............ C25D 3/38; C25D 3/58; B82Y 30/00; B82Y 40/00; H01L 21/4882
See application file for complete search history.

(56) References Cited

PUBLICATIONS

W.B. Wu et al., "Electrochemical Deposition of p-Type CuSCN in Porous n-Type $TiO_2$ Films," Electrochimica Acta, Elsevier Science Publishers, Barking, GB, vol. 52, No. 14, Mar. 16, 2007, pp. 4804-4808.
Weibing Wu et al., "Growth Mechanisms of CuSCN Films Electrodeposited on ITO in EDTA-Chelated Copper(II) and KSCN Aqueous Solution," Electrochimica Acta, Elsevier Science Publishers, Barking, GB, vol. 50, No. 11, Apr. 1, 2005, pp. 2343-2349.
Yong Ni et al., "Electrochemical Deposition Characteristics of p-CuSCN on n-ZnO Rod Array Films," Electrochimica Acta, Elsevier Science Publishers, Barking, GB, vol. 53, No. 20, Aug. 20, 2008, pp. 6048-6054.
Yong Ni et al., "Electrodeposition of p-Type CuSCN Thin Films by a New Aqueous Electrolyte with Triethanolamine Chelation," J. Am. Ceram. Soc., vol. 90, No. 9, 2007, pp. 2966-2973.
Yvonne Selk et al., "Variation of the Morphology of Electrodeposited Copper Thiocyanate Films," Science Direct, Thin Solid Films, vol. 516, 2008, pp. 7120-7124.
Kohshin Takahashi et al., "Efficiency Increase by Insertion of Electrodeposited CuSCN Layer into ITO/Organic Solid Interface in Bulk Hetero-Junction Solar Cells Consisting of Polythiophene and Fullerene," Chemistry Letters, vol. 36, No. 6, May 19, 2007, pp. 762-763.
Jie Chen et al., "Vertical Nanowire Transistor in Flexible Polymer Foil," Appl. Phys. Letters, vol. 82, No. 26, 2003, pp. 4782-4784.
French Search Report dated Feb. 13, 2013.
Chappaz-Gillot, Cyril et al., "Insights into CuSCN Nanowire Electrodeposition on Flexible Substrates," Electrochimica Acta, 2013 (7 pages).

Primary Examiner — Luan Van
Assistant Examiner — Louis Rufo
(74) Attorney, Agent, or Firm — Burr & Brown, PLLC (57) ABSTRACT

A method for forming, on a conductive or semiconductor substrate, nanowires based on CuSCN, including the steps of: preparing an aqueous electrolytic solution from a Cu(II) salt having a concentration lower than 120 mM, a Cu(II) complexing agent from the aminocarboxylic acid family, and a thiocyanate salt, the solution having a pH ranging between 0.1 and 3; electrochemically depositing the aqueous electrolytic solution on the substrate.

20 Claims, 5 Drawing Sheets

Fig. 1A  Fig. 1B

RE = reference electrode
WE = work electrode
CE = counter-electrode

METHOD FOR ELECTROCHEMICALLY MANUFACTURING CUSCN NANOWIRES

BACKGROUND OF THE INVENTION

1. Field of the Invention

The present disclosure relates to an electrochemical deposition method enabling to obtain CuSCN nanostructures, and especially nanowires, on an electrically-conductive or semiconductor substrate.

Such nanostructures may be used as transparent p-type semiconductor, on an electrically-conductive or semiconductor substrate, in an optoelectronic device such as an organic light-emitting diode (OLED), a polymer light-emitting diode (PLED), a photovoltaic device (PV), or an OPD.

2. Description of Related Art

Organic photovoltaic cells (PV) are devices capable of converting solar energy into electric energy by means of the use of semiconductor materials, to produce a photovoltaic effect. Active materials, as well as the architectures of these devices, are still evolving to meet performance and lifetime criteria enabling to widen the field of application of such technologies.

Figure 1A:
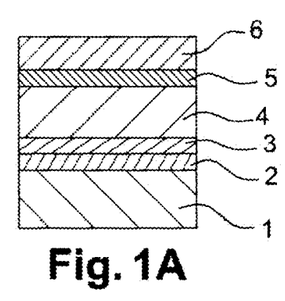
FIG. 1 shows a diagram of the conventional (A) or inverse (B) structure of organic photovoltaic cells.
Figure 1B:
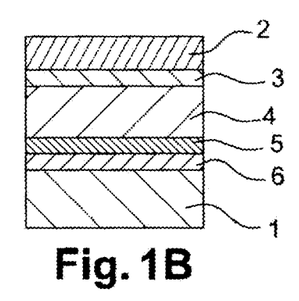

As a reminder, the conventional and inverse structures of organic PV cells are schematically shown in FIG. 1A and in FIG. 1B, respectively.

In a conventional architecture, a substrate 1 is covered with the following successive layers:
- a conductive layer 2 behaving as a first electrode;
- a p-type semiconductor layer 3;
- an active layer 4;
- an n-type semiconductor layer 5; and
- a conductive layer 6 behaving as a second electrode.

In an inverse structure, the stack has the following sequence:
- a substrate 1;
- a conductive layer 6 behaving as a first electrode;
- an n-type semiconductor layer 5;
- an active layer 4;
- a p-type semiconductor layer 3;
- a conductive layer 2 behaving as a second electrode.

Many p-type semiconductor and transparent metal oxides have been used as P interface layers in OPV cells. The most current are nickel oxide (NiO), molybdenum oxide ($MoO_5$), tungsten oxide ($WO_3$), or vanadium oxide ($V_2O_5$). However, few studies bear on the use of CuSCN, while this material has properties similar to those of the previously-mentioned oxides, being capable of being electrochemically deposited.

A method of electrochemical preparation of crystal CuSCN layers on rigid glass/ITO substrates, by cathode reduction of triethanolamine-complex Cu(II), in the presence of thiocyanates anions has been described (Ni et al., 2007). The crystal CuSCN layers thus formed are obtained by homogeneous growth in at least two directions (so-called two-dimensional or 2D structuring).

Selk et al. (2008) have described a method allowing the variation of the morphology of CuSCN layers electrochemically deposited on rigid glass/FTO substrates from an electrolyte in a water/ethanol solvent.

Wu et al. (2005) have described a method of electrochemical preparation (in potentiostatic and galvanostatic mode) of crystal CuSCN layers on rigid glass/ITO substrates. The method is carried out by cathode reduction of disodium EDTA-complexed Cu(II), resulting in a high pH, in the presence of thiocyanate ions. The obtained layers have a non-orderly so-called "2D" structuring.

Wu et al. (2007) have also described a method for electrochemically depositing CuSCN on a porous n-type $TiO_2$ film. In a first step, an electrolytic solution is prepared as described in document Wu et al. of 2005, after which the pH is lowered to 2-2.6 by addition of sulfuric acid ($H_2SO_4$).

Further, a method for integrating the previously-described "2D" layers in cells having a structure such as: ITO/CuSCN/P3HT/P3HT:PCBM/Al (Takahashi et al., 2007) has been described.

Finally, Chen et al. (2003) have described a method for manufacturing field-effect transistors from vertical CuSCN nanowires on a flexible substrate, formed through a matrix pierced with cylindrical openings.

An object of the invention tends to develop new architectures based on CuSCN and new methods for obtaining these architectures, capable of being integrated in optoelectronic devices such as OLEDs, PLEDs, PVs, and OPDs and enabling to improve their efficiencies and their stability.

DETAILED DESCRIPTION OF THE INVENTION

The present invention provides a simple method, based on electrochemical deposition, applicable on all types of substrates, especially electrically conductive or semiconductor substrates, and enabling to form nanostructures of CuSCN nanowire type, having very advantageous properties when they are used as p-type transparent semiconductor in optoelectronic devices.

According to a first aspect, the present invention thus aims at a method for forming, on an advantageously conductor or semiconductor substrate, nanostructures based on CuSCN, comprising the steps of:
- preparing an aqueous electrolytic solution:
  - from a Cu(II) salt having a concentration lower than 120 mM, a Cu(II) complexing agent from the aminocarboxylic acid family, and a thiocyanate salt;
  - having an acid pH, advantageously ranging between 0.1 et 3;
- electrochemically depositing said solution on the substrate.

The method according to the invention thus enables to form nanostructures based on CuSCN.

In the context of the invention, nanostructures are considered as so-called "3D" structures, that is, they are characterized by a privileged growth axis in a direction perpendicular to the substrate on which they are generated. Thus, such nanostructures clearly differ from a so-called "2D" layer formed by prior art methods and characterized by a homogeneous growth in at least two directions.

Nanostructures according to the invention can be distinguished from a 2D CuSCN structure by means of an X-ray diffractometer, for example, of PANalytical X'Pert MPD type by using the $K_\alpha$ radiation of cobalt ($\lambda$=1.7890 Å) in $\theta$-$2\theta$ mode. Nanostructures according to the invention are characterized by at least one ratio of the intensity of the peak at 18° to that of the peak at 31°, at 45°, or at 55° greater than 15, conversely to a 2D layer for which all ratios are lower than 15. In particular and as an example, the analysis of the DRX spectrum of the layers formed in Wu et al.'s article enables to calculate an intensity ratio of 0.4 for the 18°/31° peaks and of 1.7 for the 18°/45° peaks.

Advantageously, all ratios between the intensity of the 18° peak and the intensity of each of the 31°, 45°, and 55° peaks are greater than 15.

The nanostructures obtained in the context of the invention may advantageously be nanowires. In the context of the invention, "nanowire" designates a prismatic (for example, hexagonal) or cylindrical entity, of nanometer size, having a height-to-diameter ratio (or form factor FF) greater than or equal to 1.2. In the case of a form factor close to 1.2, it is rather spoken of nanopads.

Other nanostructures which may be considered especially are nanotubes or nanorods.

The density of nanostructures formed on completion of the method according to the invention is directly connected to the ratio of CuSCN nucleation sites on the substrate. Preferably, the density of nanostructures is sufficiently high for the formed layer to be called continuous, that is, for it to continuously coat the surface of the substrate supporting it.

In the context of the invention, "CuSCN-based nanostructures" means that the main or only component of the nanostructures is copper thiocyanate or CuSCN. However, this does not exclude the presence of minority contaminations.

Further, the nanostructures obtained according to the invention have a very good crystallinity and thus a good thermal conductivity. The crystal quality of CuSCN is especially inversely proportional to the mid-height width of the peaks observed by X-ray diffraction.

CuSCN nanostructures according to the invention are formed by means of an electrochemical deposition in precise and controlled conditions. In terms of reaction, the cathode reduction of complexed Cu(II) to Cu(I) allows, in the presence of thiocyanate anions (SCN$^-$), the precipitating of CuSCN at the cathode, according to the following reaction:

$$Cu^{2+} + e^- \rightarrow Cu^+$$

$$Cu^+ + SCN^- \rightarrow CuSCN$$

While this reaction is well known, the contribution of the invention is the determination of the deposition conditions enabling to obtain the desired nanostructures, in the case in point, nanowires, and this, on any type of substrate, especially electrically conductive or semiconductor substrates.

CuSCN is conventionally electrodeposited in a standard electrochemical cell with two or three electrodes, where a Pt wire is used as a counter-electrode with, possibly, a saturated calomel electrode (SCE) as the reference electrode.

Advantageously, the deposition is performed on a solid conductor or semiconductor substrate, which may be rigid or flexible.

According to a specific embodiment, it is not a porous substrate, such as a TiO$_2$ film, and especially an n-type TiO$_2$ film. In other words and according to this embodiment, the substrate having the deposition performed thereon is non-porous.

It may be a metal substrate. As a variation, it may be formed of at least one layer of transparent conductive oxide (TCO), for example, containing ITO (Indium Tin Oxide), GZO (Gallium-doped Zinc Oxide), AZO (aluminum-doped zinc oxide), YZO (Yttrium-doped zinc oxide), IZO (indium zinc oxide), or FTO (fluorine-doped tin oxide or SnO$_2$:F), arranged on a transparent support, for example, made of glass or of plastic (such as PET, PEN, or a polycarbonate). A conductive substrate in the formed of a transparent multiple-layer stack, formed on a glass or plastic substrate, may also be envisaged (for example, TCO/Ag/TCO).

According to the invention, the electrolytic bath used for the deposition is characterized as follows:

It advantageously is an aqueous solution, that is, mainly formed of water. Preferably, said solution contains no alcohol, and especially no ethanol.

Conveniently, this electrolytic aqueous solution is prepared from:

a Cu(II) source, advantageously a Cu(II) salt, more advantageously still copper sulfate (especially CuSO$_4$,5H$_2$O) or copper chloride (CuCl$_2$) or mixtures thereof. In adapted fashion according to the invention, the Cu(II) concentration is lower than or equal to 120 mM, advantageously lower than or equal to 80 mM. Further, it is advantageously greater than or equal to 5 mM. Thus, it more specifically ranges between 5 mM and 80 mM. It may for example be de 5 mM (pH of the solution=2.0), 12 mM (pH of the solution=1.7), 60 mM (pH of the solution=1.2), or 80 mM (pH of the solution=1.1);

a Cu(II) complexing agent from the aminocarboxylic or aminocarboxylate acid family. In adapted fashion according to the invention, aminocarboxylic acid is present in polyacid form (having at least two carboxylic acid functions). It advantageously is a tetraacetic diamine acid, for example, EDTA (ethylenediaminetetraacetic acid) or CDTA (trans-1,2-diaminocyclohexane tetraacetic acid), or EGTA (ethylene glycol tetraacetic acid) or DTPA (diethylene triamine pentaacetic acid), or a mixture thereof. Advantageously, the aminocarboxylic acid appears in the form of an acid and not in the form of a salt thereof. Thus, an in the example of EDTA, it especially appears in the form of C$_{10}$H$_{16}$N$_2$O$_8$ and not in the form of a sodium salt, such as disodium (C$_{10}$H$_{14}$N$_2$O$_8$.Na$_7$.2H$_2$O) or tetrasodium EDTA; and a thiocyanate salt as an SCN$^-$ anion source, such as KSCN or NaSCN or mixtures thereof.

Further, this electrolytic solution has an acid pH, advantageously ranging between 0.1 and 3. Thus, and preferably, the pH of the solution is:

greater than or equal to 0.1, advantageously greater than or equal to 1;

smaller than or equal to 3, advantageously smaller than or equal to 2.3, more advantageously still smaller than or equal to 2, or even smaller than 2.

In other words, and advantageously, the pH of the solution used in the context of the present invention ranges between 0.1 and 3, or even between 0.1 and 2.3 or between 0.1 and 2, or even between 1 and 2.3 or between 1 and 2, or is even greater than or equal to 1 and smaller than 2, for example, equal to 1.7.

According to a preferred embodiment, such pH values are obtained by the simple addition of the reactants present. In other words, after the reactants have been added, the pH of the solution does not require being adjusted, and in particular lowered by the addition of an acid such as sulfuric acid. Indeed, and in the context of the present invention, it has been shown that by especially starting from a salt of the acid and by then lowering the pH, for example, with H$_2$SO$_4$, the desired nanostructures, in the case in point, nanowires, would not be obtained. With no intention of being bound to any theory, probably due to the presence of the (Na$^+$) salts and/or of the SO$_4^-$ ions, the copper complexation would be modified and the growth would be different.

Thus, the important parameters to obtain the nanostructures according to the present invention are:
the nature of the complexing agent; and
the acid pH of the electrolyte; and
the relatively low Cu(II) concentration of the solution.

Advantageously, the molar or stoichiometric ratio between Cu(II) and the complexing agent of Cu(II), especially between Cu(II) and EDTA (Cu(II)/EDTA), is smaller than or equal to 1/0.8, advantageously equal to 1/1. In other words, and in adapted fashion, 1 EDTA equivalent is added. A sufficient complexing level is required and directly impacts the pH of the solution.

Further, and preferably, the molar or stoichiometric ratio between Cu(II) and the thiocyanate salt, especially between Cu(II) and KSCN (Cu(II)/KSCN), is smaller than or equal to 1/0.1, advantageously equal to 1/0.25. In other words and in adapted fashion, 0.25 of KSCN equivalent is added. An appropriate supply of thiocyanate with respect to the Cu(II) supply appears to impact the shape of the nanowires.

According to another preferred embodiment, the electrochemical deposition, and more generally the entire method according to the invention, is carried out at a temperature lower than 50° C., advantageously at ambient temperature, typically ranging between 20 and 30° C., or even between 20 and 25° C. A higher temperature appears to favor the appearing of heterogeneous structures. Further, the temperature is advantageously maintained constant during the electrochemical deposition.

It should be noted that according to a preferred embodiment, the method according to the invention excludes any anneal step, generally performed at a temperature higher than the ambient temperature.

The electrochemical deposition may further be carried out:
either at constant potential, in potentiostatic mode;
or by setting the current density, in galvanostatic mode.

The potential or the current density is advantageously selected to avoid a contamination of the CuSCN by Cu(0) which precipitates at the cathode by reduction of the complexed Cu(II) ions. According to the nature of the substrate, the potential may vary from −10 to −480 mV vs ECS in potentiostatic mode, and the current density may vary from −5 to −550 μA·cm-2 in galvanostatic mode. The potential is conventionally controlled by means of a potentiostat/galvanostat such as PARSTAT 2273 (Princeton Applied Research).

More specifically, and as will readily occur to those skilled in the art, limiting conditions according to the supply mode and to the nature of the substrate in presence are disclosed in the following table:

| | Mode: | | | |
|---|---|---|---|---|
| | Potentiostatic | | Galvanostatic | |
| Substrate: | $V_{min.}$ (mV) | $V_{max.}$ (mV) | $j_{min.}$ (μA·cm$^{-2}$) | $j_{max.}$ (μA·cm$^{-2}$) |
| Rigid covered with OTC | −480 | −100 | −300 | −100 |
| Flexible covered with OTC | −400 | −30 | −500 | −5 |
| Metallic | −200 | −10 | −550 | −100 |

Typically, the electrochemical deposition according to the invention is performed at a charge density greater than 1 and for example capable of ranging up to 200 mC·cm$^{-2}$ or beyond, essentially correlated to the duration of the deposition and to the current intensity in the electrochemical cell. Advantageously, the charge density imposed to the cathode is set so that CuSCN totally covers the desired surface so that the nanostructures form a continuous layer on the substrate. In practice, it may vary according to the nature of the substrate and is determined on a case by case basis. Thus, and as an example, the minimum charge density for a glass/ITO substrate is equal to 1.5 mC·cm$^{-2}$.

Remarkably, it has been shown that the features of the final architecture formed of the nanostructures thus formed can be controlled by adjusting the method parameters, for example as follows:

It has been shown that in potentiostatic mode, the nanowire diameter increases along with the potential increase and with the decrease of the Cu(II)/thiocyanate molar ratio.

The density of nanostructures formed at the substrate surface is linked to the nucleation rate at the level of the surface having the nanostructures growing from it, which determines the continuity of the layer thus formed.

The length (in other words, the thickness of the layer of nanostructures) can itself be controlled by the charge density imposed to the cathode during the electrochemical deposition. Thus, and generally, the thickness of layer formed of CuSCN nanostructures increases along with the charge density.

As already mentioned, the CuSCN nanostructures obtained by means of the method according to the invention may form the p-type semiconductor layer of an optoelectronic device, such as a photovoltaic panel (PV) and more specifically an organic PV, a photodetector, a PLED, or an OLED.

In other words, the method according to the invention may be used to form an optoelectronic device.

Typically, in the case of an OPV, such a device comprises:
a conductive layer;
a p-type semiconductor layer formed according to the invention;
an n-type semiconductor layer;
an active layer, typically a polymer/fullerene mixture such as poly(3-hexylthiophene)/[6,6]-phenyl-C61-butyric acid methyl (P3HT/PC$_{60}$BM) or poly[N-9'-heptadecanyl-2,7-carbazole-alt-5,5-(4',7'-di-2-thienyl-2',1',3'-benzothiadiazole)]/[6,6]-phenyl-C$_{71}$-butyrate methyl (PCDTBT/PC$_{70}$BM). The active layer may also be a polymer/polymer or molecule/molecule mixture.

There appears from the present application that the structuring of CuSCN in the form of nanostructures, and in particular of nanowires, enables to increase the contact surface area between the active layer and the p-type semiconductor. Such devices have a performance and a stability perfectly adapted to the considered applications.

Thus, and according to another aspect, the present invention relates to a method for manufacturing an optoelectronic device, according to which the transparent p-type semiconductor is deposited on the substrate by means of the above-described method.

EXAMPLES OF EMBODIMENT

The following non-limiting embodiments, in relation with the accompanying drawings, aim at illustrating the invention.

Figure 2:
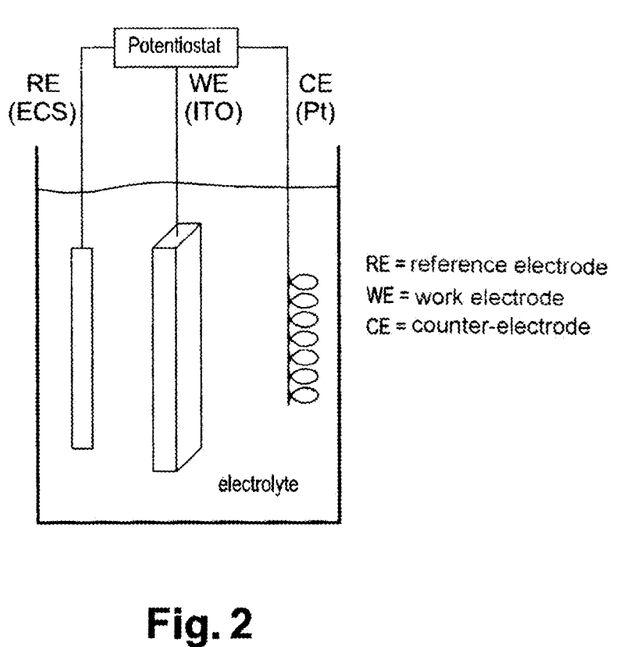
FIG. 2 shows the diagram of an electrochemical cell, illustrated for an assembly with 3 electrodes (RE: reference electrode; WE: work electrode; CE: counter-electrode).

1/Forming of CuSCN Nanowires:

CuSCN is conventionally electrodeposited in a standard electrochemical cell with three electrodes, such as illustrated in FIG. 2. A Pt wire is used as a counter-electrode and a saturated calomel electrode (SCE) is used as the reference electrode. The work electrode may be of different natures: either a metal, or a transparent substrate (rigid or flexible) covered with a transparent conductive oxide (OTC) such as for example ITO, FTO, AZO, GZO . . . . Its active surface area is approximately 2.0 cm$^2$.

The standard electrolyte composition is an aqueous solution of pentahydrate copper sulfate (CuSO$_4$ 5H$_2$O) at 12 mM, containing 1 equivalent of ethylenediaminetetraacetic acid (EDTA) or of 1,2-diaminocyclohexane-tetraacetic acid (CDTA), and 0.25 equivalent of potassium thiocyanate (KSCN).

The thin CuSCN films are obtained at ambient temperature, by electrochemical deposition at constant potential (potentiostatic mode) or by setting the current density (galvanostatic mode). The potential is advantageously selected to avoid a contamination of the CuSCN by Cu(0) which precipitates at the cathode by reduction of the complexed Cu(II) ions. According to the nature of the substrate, the potential may vary from −10 to −480 mV vs ECS in potentiostatic mode, and the current density may vary from −5 to −550 µA·cm-2 in galvanostatic mode. The potential is controlled by a PARSTAT 2273 (Princeton Applied Research) potentiostat/galvanostat.

In potentiostatic mode, the potential selection from the range determined hereabove enables to control the nanowire diameter. For example, and as shown in the following table, for a PET/ITO substrate, the average diameter of the nanowires increases by 50 nanometers every 100 mV. Similarly, the nanowire diameter decreases as the Cu(II)/thiocyanate molar ratio increases. The average form factor of the nanowires is also given as an indication:

| Potential (mV) | −100 | −200 | | −300 | | |
|---|---|---|---|---|---|---|
| Cu(II)/KSCN | | 1/0.25 | | 1/0.5 | 1/1 | 1/2 |
| Diameter (nm) | 180 | 130 | 80 | 90 | 140 | 180 |
| Average FF | 2.7 | 2.5 | 4.1 | 2.6 | 2.1 | 1.2 |

2/Analysis of the Obtained CuSCN Nanowires:

The CuSCN nanowires, obtained in the previously-described conditions, are crystalline.

Figure 3:
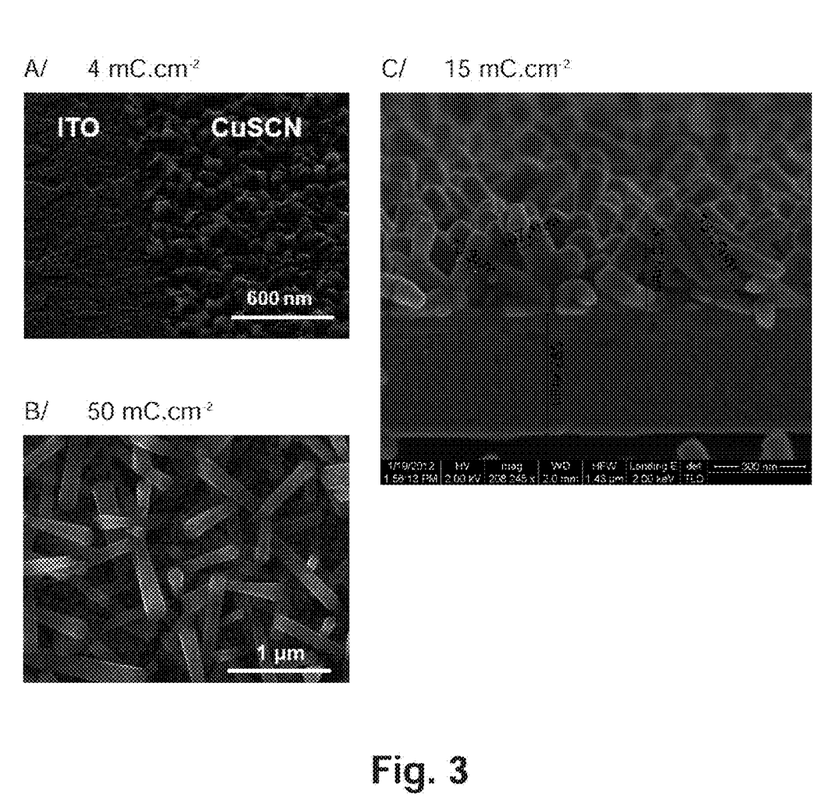
FIG. 3 shows images taken by scanning electronic microscopy (SEM) of CuSCN nanowires obtained according to the invention:
(A) a 45° view on a rigid glass/ITO substrate, for a 4 mC·cm$^{-2}$ charge density;
(B) a top view on a rigid glass/ITO substrate, for a 50 mC·cm$^{-2}$ charge density;
(C) a cross-section view on a flexible PET/ITO substrate, for a 15 mC·cm$^{-2}$ charge density.

The morphology of the thin films is studied by means of a Hitachi S-4100 scanning electronic microscope (FIG. 3). The CuSCN nanowires grow from nucleation centers at the surface of the conductive transparent oxide (OTC—FIG. 3B).

Figure 4:
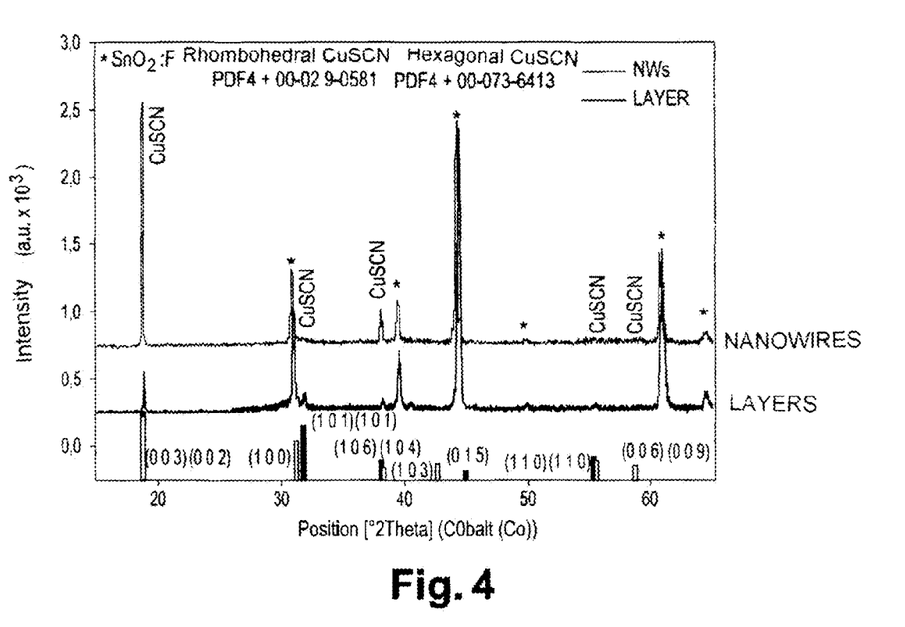
FIG. 4 shows an X-ray diffraction spectrum (XRD) of a CuSCN layer or of CuSCN nanowires obtained according to the invention, respectively, on a rigid glass/FTO substrate.

The nanowire crystal structure has been analyzed by a PANalytical X'Pert MPD X-ray diffractometer (FIG. 4), by using the K$_\alpha$ radiation of cobalt (λ=1.7890 Å) in θ-2θ mode, and then compared with a CuSCN crystal layer with no 3D nanostructuring, obtained from a Cu(II)/triethanolamine/KSCN 1:10:5 electrolyte at 12 mM.

An objective characterization of the nanowires may be obtained by comparing the relative intensity of all the diffractogram peaks with that of the most intense peak at 18° corresponding to planes {003} and {002}, as shown in the following table:

| 2D LAYER | | NANOWIRES | |
|---|---|---|---|
| 18.08° peak/rest of the peaks | Ratio | 18.72° peak/rest of the peaks | Ratio |
| 18.08°/31.70° | 3.18 | 18.72°/31.72° | 25.73 |
| 18.08°/38.08° | 6.79 | 18.72°/38.03° | 6.24 |
| 18.08°/45.47° | 11.91 | 18.72°/45.35° | 32.63 |
| 18.08°/55.42° | 7.81 | 18.72°/55.34° | 26.10 |
| 18.08°/58.91° | 12.19 | 18.72°/58.51° | 25.73 |

The 18°/38° and 18°/58° ratios, which characterize ratios relative to the multiple {00X} planes, are similar for the layers and the nanowires. However, all other ratios are from 3 to 8 times larger for CuSCN nanowires than for the layers, which indicated a preferential crystallization of the nanowires in a favored direction ({00X} planes) orthogonal to the surface (FIG. 3B). To characterize the nanowires, the ratios of the peak at 18° to the peaks at 31°, 45°, and 55° should thus be greater than 15.

The nanowire density and length can be controlled by the charge density imposed to the cathode during the electrochemical deposition, which is a function of the deposition time and of the intensity of the current in the electrochemical cell. As shown in the following table, the thickness and the roughness of the CuSCN layer, measured with a profilometer, generally increase along with the charge density.

| Charge imposed for the CuSCN deposition (mC · cm$^{-2}$) | 1.5 | 4 | 10 | 20 | 30 |
|---|---|---|---|---|---|
| Average thickness (nm) | 40 | 85 | 170 | 260 | 400 |
| Roughness (RMS - nm) | 2.9 | 1.5 | 2.2 | 3.8 | 5.3 |

Figure 5:
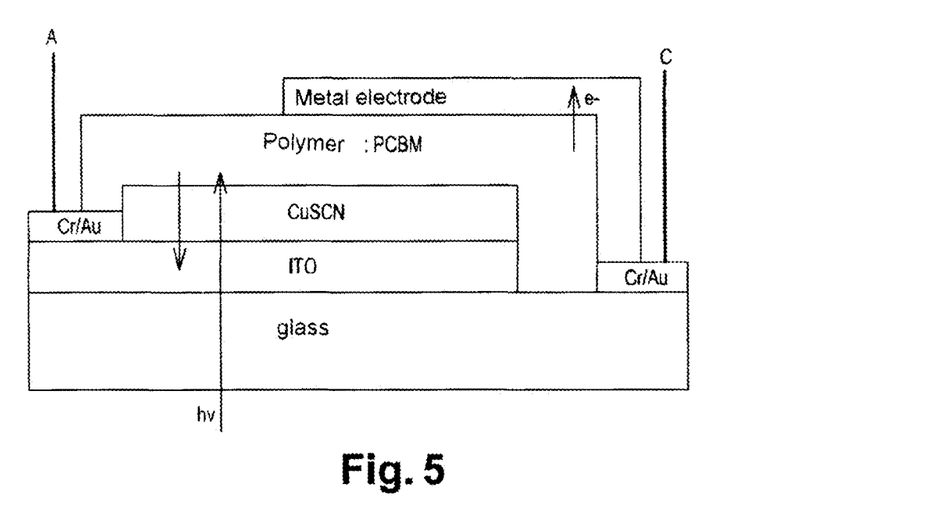
FIG. 5 shows a simplified cross-section view of an organic photovoltaic device (OPV) or cell integrating CuSCN nanowires obtained according to the invention.

3/Integration of the Obtained CuSCN Nanowires in OPV Devices:

Such CuSCN nanowires have been integrated in OPV devices of conventional structure (FIG. 5), and compared with reference standards containing a p PEDOT:PSS semiconductor layer.

Two active polymer/fullerene layers of different natures have been tested: the P3HT/PC$_{60}$BM and PCDTBT/PC$_{70}$BM mixtures. The performance of cells integrating CuSCN nanowires according to the invention with respect to the reference standards (PEDOT:PSS) on glass/ITO have been compared:

| | Active layer | | | |
|---|---|---|---|---|
| | P3HT/PC$_{60}$BM (250 nm) | | PCDTBT/PC$_{70}$BM (80 nm) | |
| P layer | CuSCN 3D | PEDOT:PSS | CuSCN 3D | PEDOT:PSS |
| Thickness (nm) | 170 | 40 | 40 | 40 |
| V$_{OC}$ (mV) | 565 | 552 | 903 | 913 |
| J$_{SC}$ (mA · cm$^{-2}$) | 8.8 | 9.3 | 9.6 | 11.9 |
| FF | 57.9 | 60.5 | 58.9 | 64.8 |
| PCE (%) | 2.9 | 3.3 | 5.1 | 7.0 |

The CuSCN structuring in the form of nanowires enables to increase the contact surface area between the active layer and the p-type semiconductor. All the formed OPV devices have a 28-mm² active surface area and are tested under an AM 1.5 illumination of 100 mW·cm⁻².

The polymer may advantageously be selected so that the energy of its highest occupied molecular orbit (HOMO) is smaller than the energy of the valence band (VB) of CuSCN ($E_{VB}$=−5.3 eV). This is true for PCDTBT ($E_{HOMO}$=−5.35 eV), which seems more appropriate in the device than P3HT ($E_{HOMO}$=−5.0 eV).

Figure 6A:
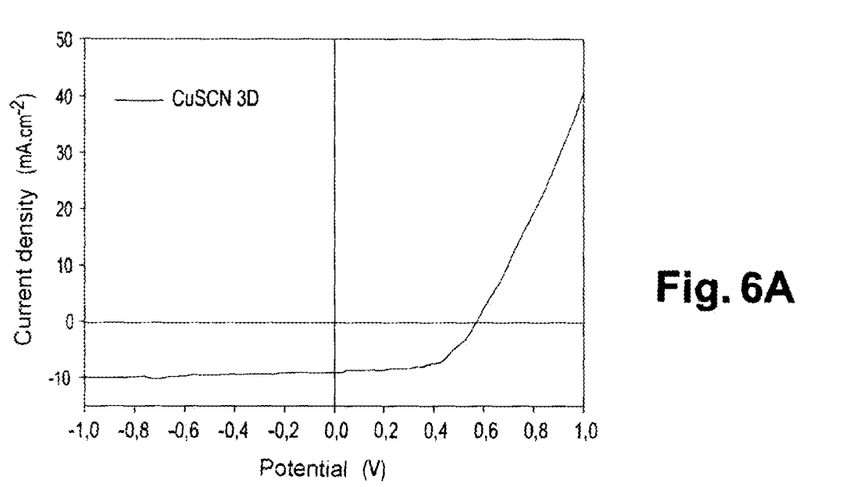
FIG. 6 shows curves of the current density versus the potential, of cells integrating CuSCN nanowires according to the invention or a reference PEDOT: PSS layer.
 (A) for an active P3HT/PC$_{60}$BM layer;
 (B) for an active PCDTBT/PC$_{70}$BM layer.
Figure 6B:
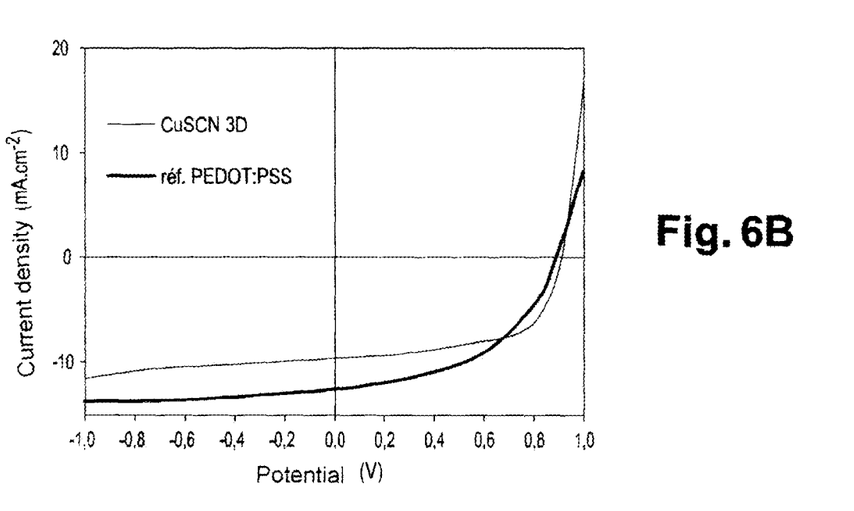

On glass/ITO substrates, the best results have been obtained for film thicknesses on the order of 170 nanometers for P3HT/PC$_{60}$BM and of 40 nanometers for PCDTBT/PC$_{70}$BM (FIG. 6). The performance strongly decreases as the length of the CuSCN nanowires increases, and thus as the film thickness increases, with a drop of the short-circuit current density ($J_{SC}$). The latter actually remains the limiting characteristic of the device, while the open-circuit voltage ($V_{OC}$) is comparable with reference values.

The efficiencies obtained with an interface layer of CuSCN nanowires, although lower than standard cells containing a PEDOT:PSS layer, have no history in literature with this material.

Figure 7:
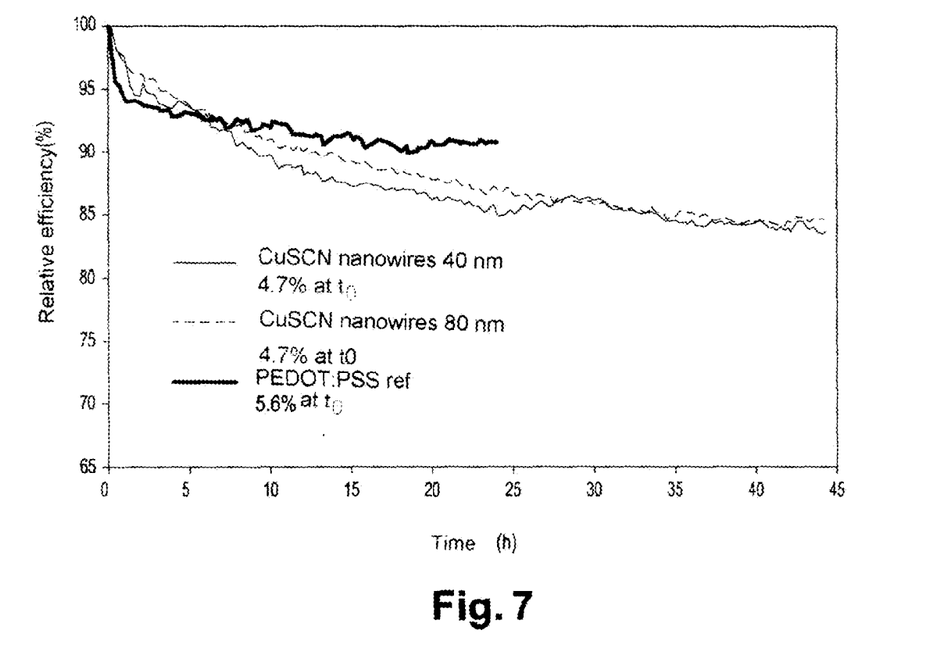
FIG. 7 shows aging curves of cells integrating CuSCN nanowires obtained according to the invention or of a reference PEDOT:PSS layer, respectively, in the case of an active PCDTBT/PC$_{70}$BM layer.

Stability studies have also been performed to compare the performance of devices comprising CuSCN nanowires with those of standard devices (FIG. 7). The first 45 hours of aging under a continuous illumination in a glove box reveal a decrease of on the order of 15% of the performance of devices integrating thin nanostructured films of a thickness lower than 100 nanometers. Over the first 25 hours, the loss is smaller by 10% than for reference devices.

The electric performance of cells formed with an active PCDTBT/PC$_{70}$BM layer and on flexible substrates integrating different types of TCO are summed up in the following table. The thin CuSCN films are formed of nanowires having a length on the order of 330 nanometers and a diameter ranging from 80 to 130 nanometers:

|  | Substrate | | | |
| --- | --- | --- | --- | --- |
|  | PET/ITO | | PET/ITO multilayer | |
| P layer | CuSCN 3D | PEDOT:PSS | CuSCN 3D | PEDOT:PSS |
| $V_{OC}$ (mV) | 749 | 743 | 729 | 798 |
| $J_{SC}$ (mA·cm⁻²) | 7.5 | 10.4 | 8.0 | 10.1 |
| FF | 43.5 | 38.9 | 42.6 | 46.7 |
| PCE (%) | 2.4 | 3.0 | 2.5 | 3.8 |

The different advantages of the present invention clearly appear from the foregoing:
- the low temperature at which the method is implemented (20-25° C.) enables to use flexible temperature-sensitive substrates and to decrease the cost of the method;
- it is possible to obtain a thin nanostructured CuSCN film with different thicknesses easily controllable by the charge density imposed to the cathode;
- the obtained film is thin, nanostructured, and has a controlled morphology, that is, its length, its diameter, and the density of nanowires forming it can be determined;
- there is no need to anneal the CuSCN nanowires, the obtained film is directly thin, homogeneous, continuous and crystalline;
- a good OPV cell performance can be obtained; power conversion efficiency (PCE) and stability.

REFERENCES

J. Chen, R. Konenkamp. Vertical nanowire transistor in flexible polymer foil. *Appl. Phys. Lett.* 82, 2003, p. 4782-4784.

Y. Ni, Z. Jin, Y. Fu. Electrodeposition of p-type CuSCN thin films by a new aqueous electrolyte with triethanolamine chelation. *J. Am. Ceram. Soc.*, 90, 2007, 2966-2973.

Y. Selk, T. Yoshida, T. Oekermann. Variation of the morphology of electrodeposited copper thiocyanate films. *Thin Solid Films*, 516, 2008, 7120-7124.

K. Takahashi, S. Suzaka, Y. Sigeyama, T. Yamaguchi, J. Nakamura, K. Murata. Efficiency increase by insertion of electrodeposited CuSCN layer into ITO/organic solid interface in bulk hetero-junction solar cells consisting of polythiophene and fullerene. *Chem. Lett.*, 36, 2007, 762-763.

W. Wu, Z. Jin, Z. Hua, Y. Fu, J. Qiu. Growth mechanisms of CuSCN films electrodeposited on ITO in EDTA-chelated copper(II) and KSCN aqueous solution. *Electrochim. Acta*, 50, 2005, 2343-2349.

W Wu, Z. Jin, G Hu, S. Bu. Electrochemical deposition of p-type CuSCN in porous n-type TiO$_2$ films. *Electrochim. Acta*, 52, 2007, 4804-4808.

The invention claimed is:

1. A method for forming nanowires based on CuSCN, comprising the steps of:
   - providing a conductive or semiconductor substrate, wherein the substrate is non-porous;
   - preparing an aqueous electrolytic solution consisting essentially of a Cu(II) salt having a concentration lower than 120 mM, a Cu(II) complexing agent from the aminocarboxylic acid family, and a thiocyanate salt, said solution having a pH ranging between 0.1 and 3; and
   - electrochemically depositing the nanowires from the aqueous electrolytic solution directly on the non-porous substrate.

2. The method of claim 1, wherein the aqueous electrolytic solution has a pH ranging between 0.1 and 2.3.

3. The method of claim 1, wherein the substrate is a metal.

4. The method of claim 1, wherein the substrate is formed of at least one layer of a transparent conductive oxide arranged on a transparent support made of glass or plastic.

5. The method of claim 1, wherein the Cu(II) salt is selected from the group consisting of CuSO$_4$, CuCl$_2$ and mixtures thereof.

6. The method of claim 1, wherein the complexing agent of Cu(II) from the aminocarboxylic acid family is in polyacid form selected from the group consisting of EDTA, CDTA, EGTA, DTPA and mixtures thereof.

7. The method of claim 1, wherein the thiocyanate salt is selected from the group consisting of KCSN, NaCSN and mixtures thereof.

8. The method of claim 1, wherein the Cu(II) salt used to prepare the aqueous electrolytic solution has a concentration greater than or equal to 5 mM and less than or equal to 80 mM.

9. The method of claim 1, wherein a molar ratio between Cu(II) and the copper complexing agent in the aqueous electrolytic solution is less than or equal to 1/0.8.

10. The method of claim 1, wherein a molar ratio between Cu(II) and the thiocyanate salt in the aqueous electrolytic solution is less than or equal to 1/0.1.

11. The method of claim 1, wherein the electrochemical deposition is performed at a constant temperature.

12. The method of claim 1, wherein a deposition temperature is less than 50° C.

13. The method of claim 1, wherein the electrochemical deposition is performed in a potentiostatic mode at a potential ranging between −10 and −480 mV.

14. The method of claim 1, wherein the electrochemical deposition is performed in a galvanostatic mode with a current density between −5 and −550 $\mu A \cdot cm^{-2}$.

15. A method for manufacturing an optoelectronic device, wherein a transparent p-type semiconductor is deposited on a conductor or semiconductor substrate by means of the method of claim 1.

16. The method of claim 2, wherein the pH of the aqueous electrolyte solution is in a range of at least greater than or equal to 1 to 2.3 or less.

17. The method of claim 16, wherein the pH of the aqueous electrolyte solution is 1.7.

18. The method of claim 9, wherein the molar ratio between Cu(II) and the copper complexing agent in the aqueous electrolytic solution is 1/1.

19. The method of claim 10, wherein the molar ratio between Cu(II) and the thiocyanate salt in the aqueous electrolytic solution is 1/0.25.

20. The method of claim 12, wherein the deposition temperature ranges between 20 and 30° C.

* * * * *